(12) United States Patent
Koh et al.

(10) Patent No.: US 8,803,167 B2
(45) Date of Patent: Aug. 12, 2014

(54) ORGANIC LIGHT EMITTING DIODE DISPLAY

(75) Inventors: Sung-Soo Koh, Yongin (KR); Chul-Woo Jeong, Yongin (KR); Tae-Gon Kim, Yongin (KR); Hee-Seong Jeong, Yongin (KR); Soon-Ryong Park, Yongin (KR); Woo-Suk Jung, Yongin (KR); Il-Ryong Cho, Yongin (KR); Tae-Kyu Kim, Yongin (KR); Jae-Yong Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 51 days.

(21) Appl. No.: 13/244,281

(22) Filed: Sep. 24, 2011

(65) Prior Publication Data

US 2012/0097990 A1    Apr. 26, 2012

(30) Foreign Application Priority Data

Oct. 26, 2010    (KR) ........................ 10-2010-0104827

(51) Int. Cl.
*H01L 29/18*    (2006.01)

(52) U.S. Cl.
USPC .......... 257/88; 257/98; 257/40; 257/E27.119; 257/E33.067; 438/22; 438/29; 438/34; 313/498; 313/506

(58) Field of Classification Search
USPC ................ 257/88, 40, E27.119, 98; 313/498, 313/503–506, 512; 438/22, 29, 34
See application file for complete search history.

(56) References Cited

U.S. PATENT DOCUMENTS

| | | | |
|---|---|---|---|
| 7,646,146 B2 * | 1/2010 | Cok | 313/506 |
| 7,667,393 B2 * | 2/2010 | Fukunaga | 313/506 |
| 8,525,406 B2 * | 9/2013 | Kim et al. | 313/512 |
| 2007/0035225 A1 | 2/2007 | Lee et al. | |
| 2007/0108899 A1 * | 5/2007 | Jung et al. | 313/506 |

FOREIGN PATENT DOCUMENTS

| | | |
|---|---|---|
| JP | 2007-134299 | 5/2007 |
| KR | 10-0354136 | 9/2002 |
| KR | 10-2010-0047457 | 5/2010 |

* cited by examiner

*Primary Examiner* — Ori Nadav
*Assistant Examiner* — Lauren R Bell
(74) *Attorney, Agent, or Firm* — Robert E. Bushnell, Esq.

(57) ABSTRACT

An organic light emitting diode (OLED) display according to an exemplary embodiment includes a display substrate on which a plurality of organic light emitting diodes are formed; a conducting material layer contacting one of electrodes included in the organic light emitting diode; an encapsulation substrate facing the display substrate; and an anti-reflective light transmission layer that is formed on a surface of the encapsulation substrate and is connected to the conducting material layer.

11 Claims, 6 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on 26 Oct. 2010 and there duly assigned Serial No. 10-2010-0104827.

BACKGROUND OF THE INVENTION

1. Field of the Invention

The described technology relates generally to an organic light emitting diode (OLED) display, and more particularly, to an organic light emitting diode (OLED) display that improves light extraction efficiency and lowers power consumption.

2. Description of the Related Art

In general, an organic light emitting diode (OLED) display is configured by a top emission type, and a cathode included in an organic light emitting diode is made of a transparent material. This is for light penetrating through the cathode when light that is generated from the light emitting layer included in the organic light emitting diode is emitted to the light emitting surface of the organic light emitting diode (OLED) display.

However, in the organic light emitting diode (OLED) display, when the electrode is made of the transparent material, a problem by a resistance characteristic (e.g.: current-resistance (IR)) occurs, such that power consumption of the organic light emitting diode (OLED) display is increased.

In addition, in the organic light emitting diode (OLED) display, a polarizing plate or retardation plate is disposed at the side of the encapsulation substrate in order to suppress reflection of external light, and in this case, since light that is generated in the organic emission layer including the organic light emitting diode is emitted to the outside through a polarizing plate or retardation plate, a certain amount of light is largely lost thereby lowering light extraction efficiency.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode (OLED) display that can improve light extraction efficiency of light emitted by an organic light emitting diode and lower power consumption.

An exemplary embodiment provides an organic light emitting diode (OLED) display including a display substrate on which a plurality of organic light emitting diodes are formed; a conducting material layer contacting one of electrodes included in the organic light emitting diode; an encapsulation substrate facing the display substrate; and an anti-reflective light transmission layer that is formed on a surface of the encapsulation substrate and is connected to the conducting material layer.

The conducting material layer may be formed on the surface of the anti-reflective light transmission layer, the display substrate may include a substrate main body that has a plurality of pixel areas separated from each other and a non-pixel area positioned around the plurality of pixel areas, and the plurality of organic light emitting diodes may be disposed for each of the plurality of pixel areas.

The conducting material layer may correspond to the non-pixel area, and the conducting material layer may include any one material that is selected from the group consisting of silver (Ag), chromium (Cr), conductive carbon, and combinations thereof.

A groove may be formed on the anti-reflective n light transmission layer, the conducting material layer may be inserted into the groove, and the conducting material layer may be formed of a conductive black layer having black.

The conductive black layer may include metal colored with black or carbon black having electrical conductivity, a hole may be formed on the anti-reflective light transmission layer, and the conductive black layer may be inserted into the hole.

The display substrate may include a substrate main body that has a plurality of pixel areas separated from each other and a non-pixel area positioned around the plurality of pixel areas, and the conducting material layer may include a black layer having black and a non-black layer having no black.

The black layer and the non-black layer may correspond to the non-pixel area, and the black layer and the non-black layer may be alternately disposed, the non-black layer may be formed on the surface of the anti-reflective n light transmission layer, and the black layer may be formed and inserted into the hole formed in the anti-reflective n light transmission layer.

The anti-reflective light transmission layer may be positioned on the surface of the encapsulation substrate facing the display substrate, and the anti-reflective light transmission layer may include any one material that is selected from the group consisting of polyethyleneterephthalate (PET), triacetylcellulose (TAC), and polyvinyl alcohol (PVA).

According to exemplary embodiments, an organic light emitting diode (OLED) display can efficiently suppress external light reflection, and improve light extraction efficiency of light emitted by the organic light emitting diode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
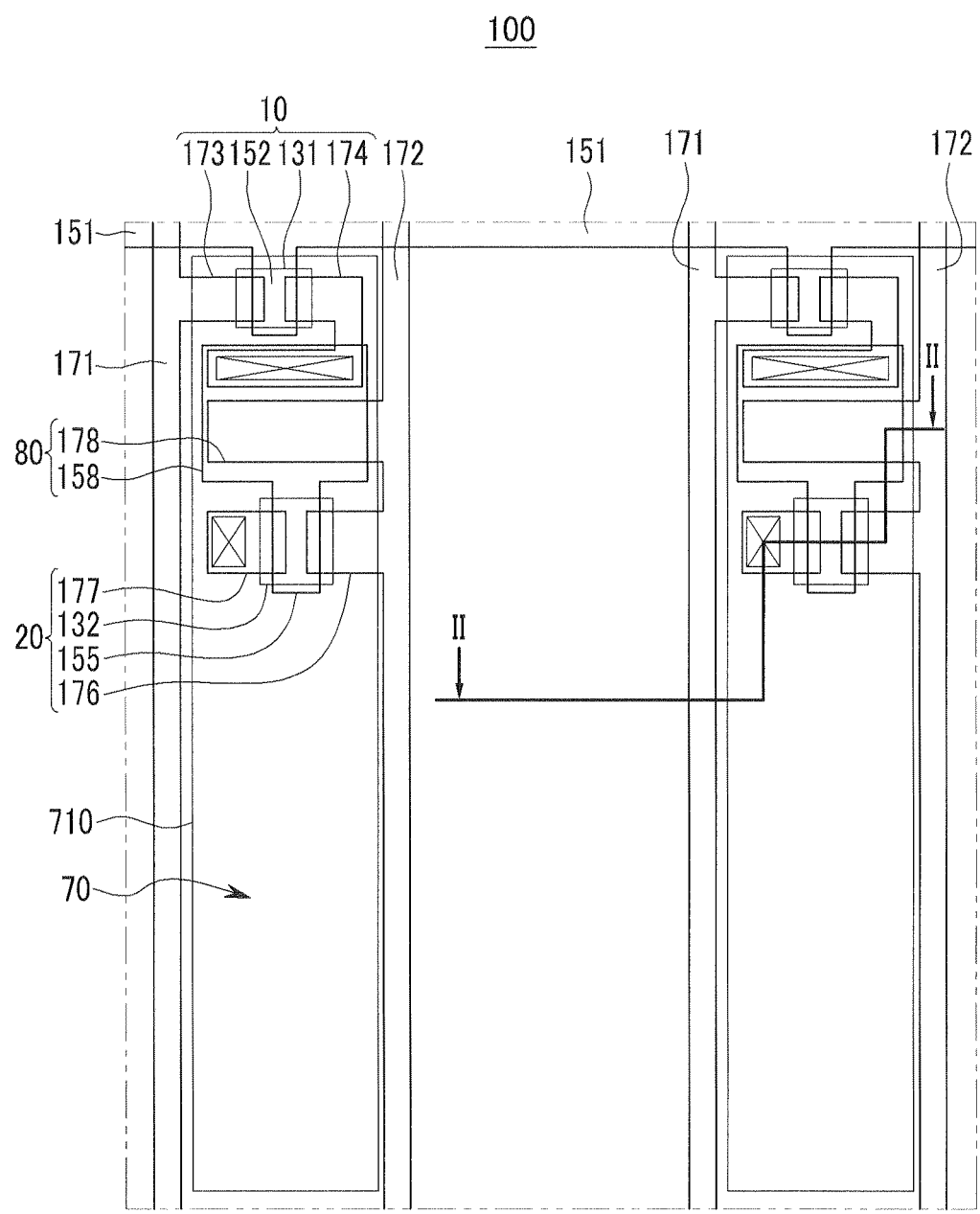
FIG. 1 is a layout view of an organic light emitting diode (OLED) display according to the first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, in various exemplary embodiments, the same reference numerals are used in respects to the constituent elements having the same constitution and illustrated in the first exemplary embodiment, and in the other second exemplary embodiment, only constitution that is different from the first exemplary embodiment is illustrated.

The drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it does not mean that they should be on another element based on a gravity direction but they may be on or under another element based on a gravity direction, and it can be directly on the other element or intervening elements may also be present.

Hereinafter, referring to FIGS. 1 to 2, the first exemplary embodiment will be described.

Figure 2:
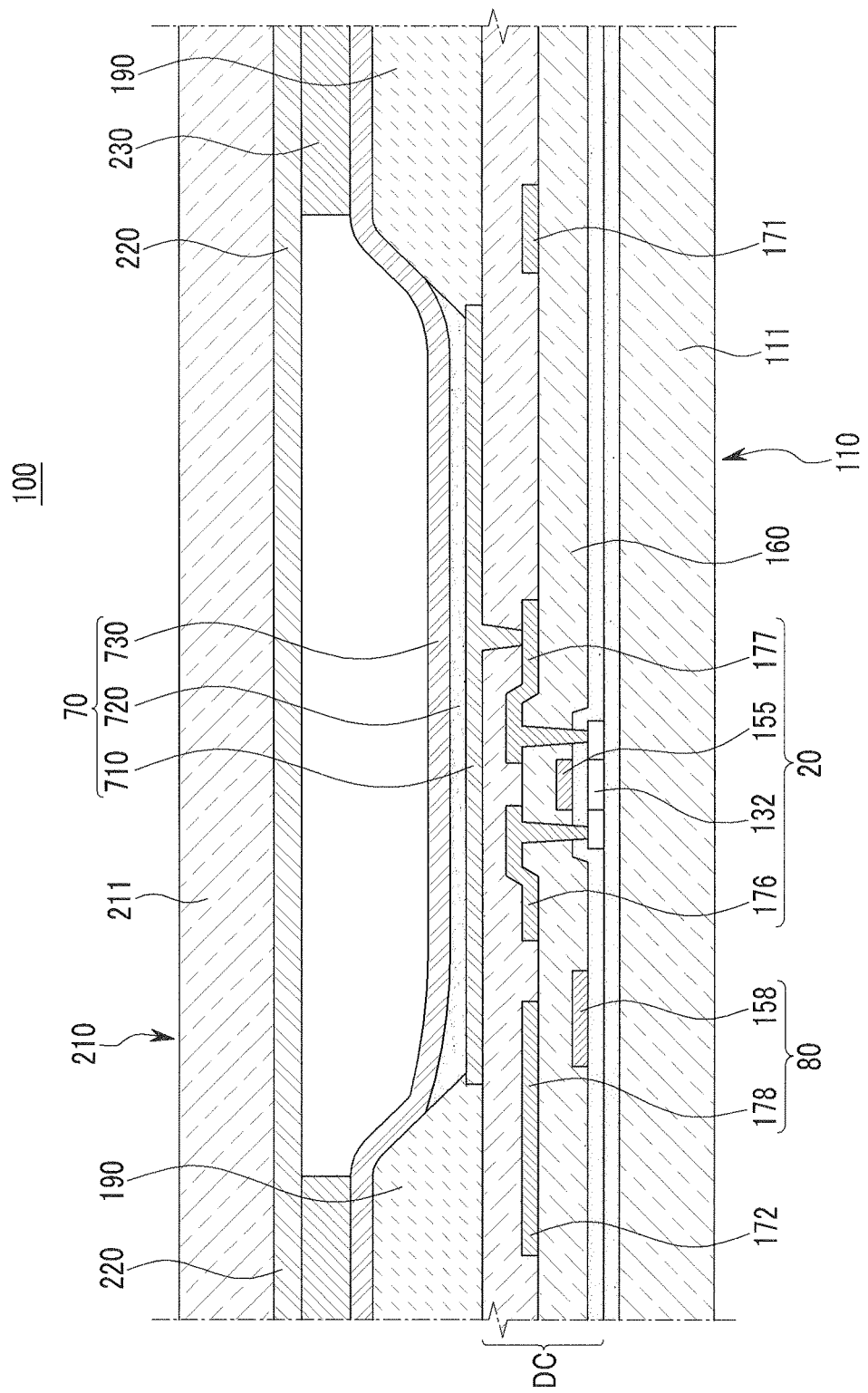
FIG. 2 is a cross-sectional view that is taken along line A-A of FIG. 1.

Referring to FIGS. 1 and 2, an organic light emitting diode (OLED) display 100 according to the first exemplary embodiment includes a display substrate 110 and an encapsulation substrate 210 that is attached to the display substrate 110 and sealed.

The display substrate 110 includes a first substrate main body 111, a driving circuit part (DC) and a plurality of organic light emitting diodes 70.

The first substrate main body 111 is formed of an insulating substrate that is made of glass, quartz, ceramic, plastic and the like. However, the first exemplary embodiment is not limited thereto, and the first substrate main body 111 may be formed of a metal substrate that is made of stainless steel and the like.

In addition, the first substrate main body 111 is classified into a plurality of pixel areas that are separated from each other and a non-pixel area that is disposed around the plurality of pixel areas.

In FIG. 1, an active matrix (AM) type organic light emitting diode (OLED) display 100 that has a two-transistor-one-capacitance (2Tr-1Cap) structure which includes one pixel area having two thin film transistors (TFT) 10 and 20 and one capacitor 80 is shown, but the first exemplary embodiment is not limited thereto.

Accordingly, the organic light emitting diode (OLED) display 100 may be provided with three or more thin film transistors and two or more capacitors in one pixel, and a separate wire may be further formed to provide various structures. Herein, the pixel means a minimum unit displaying an image, and is disposed for each pixel area. The organic light emitting diode (OLED) display 100 displays an image through a plurality of pixels.

The display substrate 110 includes a switching thin film transistor 10, a driving thin film transistor 20, a capacitor element 80 and an organic light emitting diode (OLED) 70 for each one pixel. Herein, a configuration that includes the switching thin film transistor 10, thin film transistor 20 and capacitor 80 is called the driving circuit part DC. The driving circuit part DC is formed on the first substrate main body 111 and drives the organic light emitting diode 70. That is, the organic light emitting diode 70 emits light according to the driving signal that is transferred from the driving circuit part DC and displays an image. However, the driving circuit part of the exemplary embodiment is not limited to the above exemplified structure, and the driving circuit part DC may be formed in various structures within a range that can be easily modified by those who are skilled in the art.

In addition, the display substrate 110 further includes a gate line 151 that is disposed along a predetermined direction, and a data line 171 and a common power line 172 that are insulated from and cross the gate line 151. One pixel may be defined by the gate line 151, data line 171 and common power line 172 as the boundary, but the definition of the pixel is not limited thereto.

A plurality of organic light emitting diodes 70 are formed in the corresponding pixel areas, respectively, and emit light according to a driving signal transmitted from the driving circuit part DC. The organic light emitting diode 70 includes a first electrode 710 that is an anode, a second electrode 730 that is a cathode, and an organic emission layer 720 that is disposed between the first electrode 710 and the second electrode 730. However, the first exemplary embodiment is not limited thereto. Therefore, the first electrode 710 may become the cathode, and the second electrode 730 may become the anode.

The first electrode 710, the organic emission layer 720 and the second electrode 730 are sequentially stacked on the pixel area of the first substrate main body 111. Holes and electrons are injected into the organic emission layer 720 from the first electrode 710 and the second electrode 730. When exciton in which the injected holes are cohered with the electron falls from the exited state to the bottom state, light is emitted.

The first electrode 710 is formed in a reflective layer, and the second electrode 730 is formed in a semi-transmission layer. Therefore, light generated in the organic emission layer 720 is emitted through the second electrode 730. That is, in the first exemplary embodiment, the organic light emitting diode (OLED) display 100 has a structure of a top emission type.

Unlike this, the organic light emitting diode (OLED) display may be configured by a structure of a double-sided emission type by forming the second electrode and the first electrode made of the semi-transmission film.

The reflective layer and semi-transmission layer are made by using at least one metal of magnesium (Mg), silver (Ag), gold (Au), calcium (Ca), lithium (Li), chromium (Cr) and aluminum (Al) or an alloy thereof. In this case, the reflective layer and the semi-transmission layer are determined by the thickness. In general, the semi-transmission layer has a thickness of 200 nm or less. As the thickness of the semi-transmission layer is decreased, transmittance of light is increased, and as the thickness is increased, the transmittance of light is decreased.

In addition, the first electrode 710 may further include a transparent conductive layer. That is, the first electrode 710 may have a multilayered structure that includes the reflective layer and transparent conductive layer. As the transparent conductive material, material such as ITO (Indium Tin Oxide), IZO (Indium Zinc Oxide), ZnO (zinc oxide) or $In_2O_3$ (Indium Oxide) may be used. The transparent conductive layer has a relatively high work function, and is disposed between the reflective layer and organic emission layer 720.

In addition, the organic emission layer 720 is formed of a multilayer that includes at least one of the emission layer, hole injection layer (HIL), hole transport layer (HTL), electron transport layer (ETL) and electron injection layer (EIL). In the case when the organic emission layer 720 includes all of them, the hole injection layer (HIL) is disposed on the first electrode 710 that is the anode. The hole transport layer (HTL), emission layer, electron transport layer (ETL), and electron injection layer (EIL) are sequentially layered thereon. In addition, the organic emission layer 720 may further include the other layer if necessary.

In addition, the display substrate 110 further includes the pixel definition layer 190. The pixel definition layer 190 has an opening that exposes the first electrode 710 of the organic light emitting diode 70. That is, the pixel definition layer 190 corresponds to the non-pixel area of the first substrate main body 111, and the opening of the pixel definition layer 190 corresponds to the pixel area of the first substrate main body 111.

The capacitor element 80 includes a pair of capacitor plates 158 and 178 disposed while the interlayer insulating layer 160 is disposed therebetween. Herein, the interlayer insulating layer 160 is made of a dielectric material. The capacitor capacitance is determined by the charge that is accumulated in the capacitor element 80 and the voltage between both capacitor plates 158 and 178.

The switching thin film transistor 10 includes a switching semiconductor layer 131, a switching gate electrode 152, a switching source electrode 173 and a switching drain electrode 174. The driving thin film transistor 20 includes a driving semiconductor layer 132, a driving gate electrode 155, a driving source electrode 176 and a driving drain electrode 177.

The switching thin film transistor 10 is used as a switching element that selects the pixel that emits light. The switching gate electrode 152 is connected to the gate line 151. The switching source electrode 173 is connected to the data line 171. The switching drain electrode 174 is separated from the switching source electrode 173 and is connected to the capacitor plate 158.

The driving thin film transistor 20 applies a driving power, for emitting light from the organic emission layer 720 of the organic light emitting diode 70, to the first electrode 710 in the selected pixel. The driving gate electrode 155 is connected to the capacitor plate 158 that is connected to the switching drain electrode 174. The driving source electrode 176 and the second capacitor plate 178 are each connected to the common power line 172. The driving drain electrode 177 is connected to the first electrode 710 of the organic light emitting diode 70 through the electrode contact hole.

By the above structure, the switching thin film transistor 10 is operated by the gate voltage that is applied to the gate line 151 and transfers the data voltage that is applied to the data line 171 to the driving thin film transistor 20. The voltage that corresponds to a difference between the common voltage, which is applied from the common power line 172 to the driving thin film transistor 20, and the data voltage, which is transferred from the switching thin film transistor 10, is stored in the capacitor element 80, and the current that corresponds to the voltage that is stored in the capacitor element 80 flows through the driving thin film transistor 20 to the organic light emitting diode 70 to allow the organic light emitting diode 70 to emit light.

The encapsulation substrate 210 includes a second substrate main body 211, an anti-reflective light transmission layer 220, a conducting material layer 230. The second substrate member 211 is formed of a transparent insulating substrate that is made of glass, quartz, ceramic, plastic or the like. The second substrate main body 211 is separated from the organic light emitting diode 70.

The anti-reflective light transmission layer 220 is formed on the second substrate main body 211 and is configured in a film form, such that it is attached to the front surface of the second substrate main body 211. The anti-reflective light transmission layer 220 is disposed on the surface of the encapsulation substrate 210 facing the display substrate 110, and may be made of polyethyleneterephthalate (PET), triacetylcellulose (TAC), and polyvinyl alcohol (PVA) and the like.

The conducting material layer 230 is formed on the anti-reflective light transmission layer 220 and is disposed on a location corresponding to the non-pixel area of the first substrate main body 111. The conducting material layer 230 may be made of Ag, Cr, conductive carbon and the like.

The conducting material layer 230 is contacted with the second electrode 730 and electrically connected thereto, thereby acting as an auxiliary electrode when the encapsulation substrate 210 is attached to the display substrate 110. Since the second electrode 730 should be formed of the transparent electrode not to prevent transmission of light, the thickness thereof is very small, such that a resistance is large. However, like the exemplary embodiment, if the conducting material layer 230 is contacted with the second electrode 730, resistance of the second electrode 730 is lowered, thereby lowering entire power consumption.

The anti-reflective light transmission layer 220 prevents external light from unnecessarily transmitting into the organic light emitting diode (OLED) display 100, and allows light emitted from the organic light emitting diode 70 to be not reflected but emitted to the outside. Accordingly, the reflection of external light is reduced and the light extraction efficiency is improved. The anti-reflective light transmission layer 220 does not cause a polarizing phenomenon, such that it is possible to prevent deterioration of the light extraction efficiency because of the polarizing phenomenon.

By the above configuration, the organic light emitting diode (OLED) display 100 according to the first exemplary embodiment may efficiently suppress reflection of external light. In addition, the organic light emitting diode (OLED) display 100 may minimize a loss of light in the process for emitting light that is generated in the organic light emitting diode 70 to the outside by improving light extraction efficiency. In addition, since the resistance is lowered, it may be driven with a low power.

Hereinafter, referring to FIG. 3, the second exemplary embodiment will be described.

Since the organic light emitting diode (OLED) display according to the second exemplary embodiment is configured by the same structure as the organic light emitting diode (OLED) display according to the first exemplary embodiment with the exception of the structure of the anti-reflective light transmission layer, for convenience, the overlapping description for the same structure will be omitted.

Figure 3:
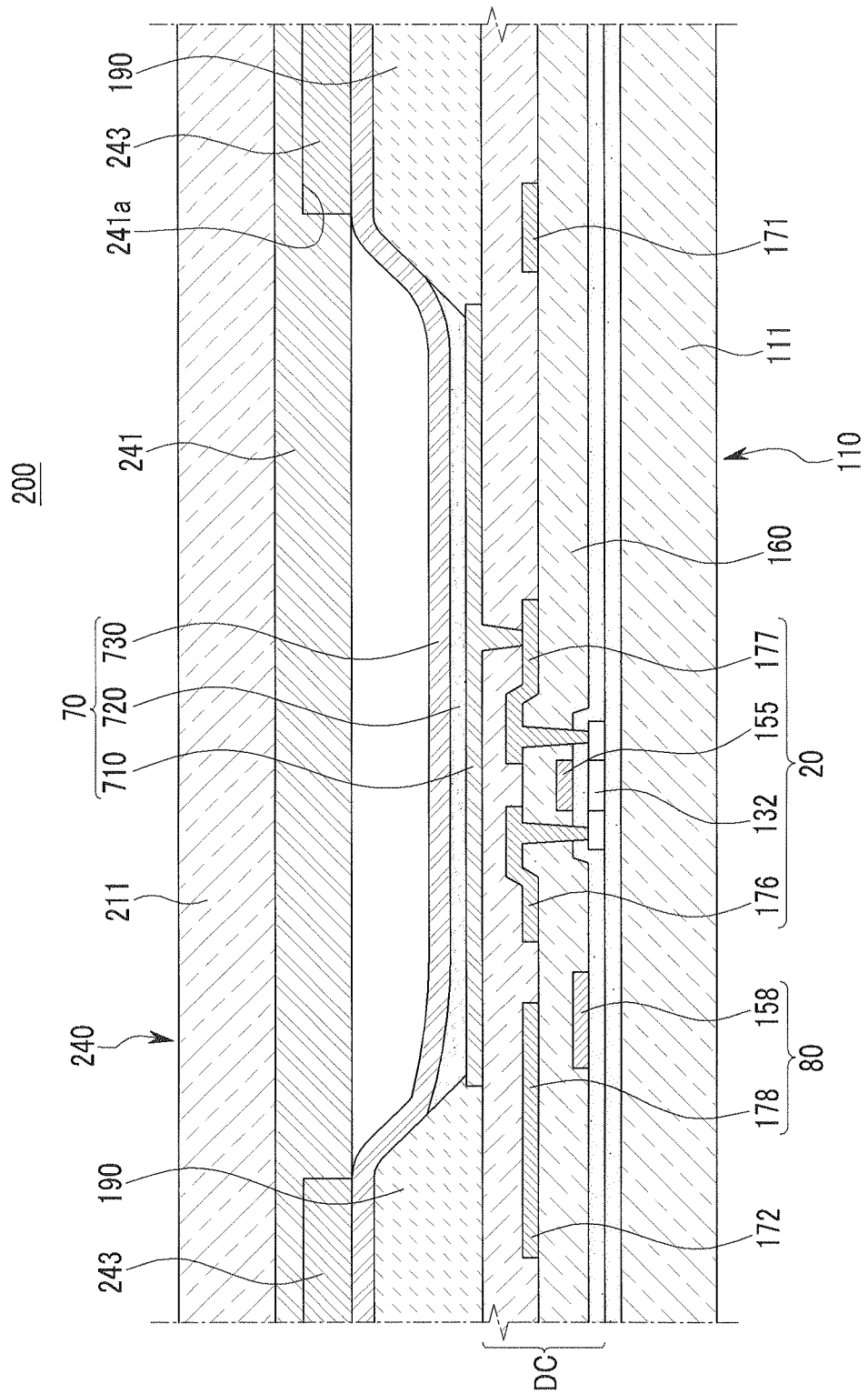
FIG. 3 is a cross-sectional view of an organic light emitting diode (OLED) display according to the second exemplary embodiment.

As shown in FIG. 3, the organic light emitting diode (OLED) display 200 according to the second exemplary embodiment includes a display substrate 110 that includes the organic light emitting diode 70, and an encapsulation substrate 240 attached and sealed to the display substrate 110.

A anti-reflective light transmission layer 241 is formed on the entire surface of the second substrate main body 211 of the encapsulation substrate 240, and a groove 241a that receives a conducting material layer 243 is formed on the anti-reflective light transmission layer 241. The conducting material layer 243 is inserted into the groove 241a and surrounded by the anti-reflective light transmission layer 241, and corresponds to the non-pixel area of the display substrate 110. That is, the conducting material layer 241 faces the pixel definition layer 190 of the display substrate 110, and when the encapsulation substrate 240 is attached to the display substrate 110, it is contacted with the second electrode 730 and electrically connected thereto.

As described above, when the conducting material layer 243 is formed in the non-pixel area, it is possible to prevent the deterioration of the light extraction efficiency because of the conducting material layer 243, and the conducting material layer 243 is contacted with the second electrode 730 and acts as the auxiliary electrode, thereby lowering power consumption.

In addition, when the groove 241a is formed in the anti-reflective light transmission layer 241 and the conducting material layer 243 is inserted into this groove, since the thickness of the anti-reflective light transmission layer 241 in the pixel area is more increased, the function of the anti-reflective light transmission layer is improved, thereby more improving light transmittance.

Hereinafter, referring to FIG. 4, the third exemplary embodiment will be described.

Figure 4:
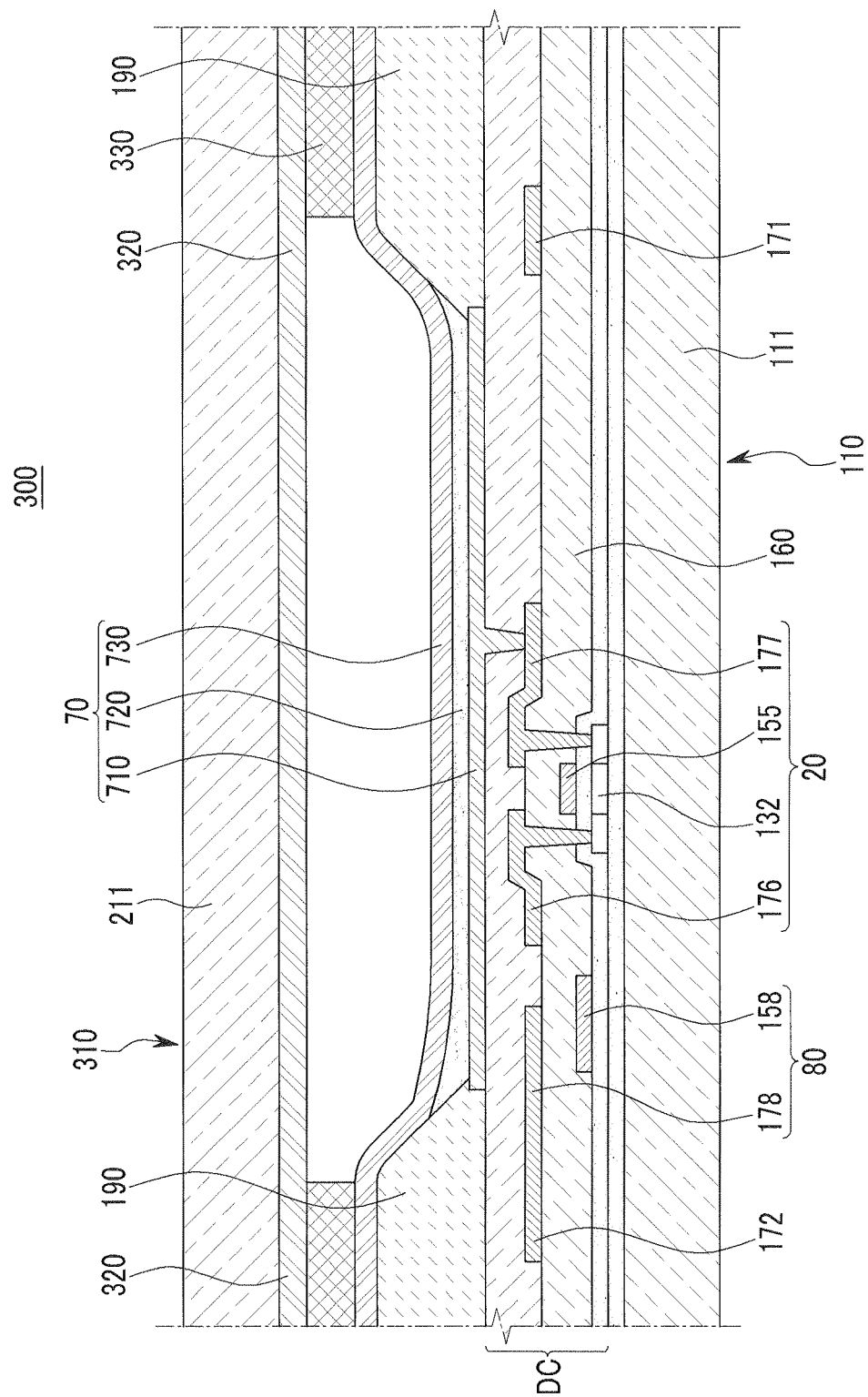
FIG. 4 is a cross-sectional view of an organic light emitting diode (OLED) display according to the third exemplary embodiment.

As shown in FIG. 4, the organic light emitting diode (OLED) display 300 according to the third exemplary embodiment includes a display substrate 110 that includes the organic light emitting diode 70, and an encapsulation substrate 310 attached and sealed to the display substrate 110.

An anti-reflective light transmission layer 320 is formed on the front surface of the second substrate main body 211 of the encapsulation substrate 310, and a conductive black layer 330 is formed on the anti-reflective light transmission layer 320. The conductive black layer 330 is a kind of conducting material layer, and includes a conductive material such as metal and carbon black that is colored with black. The conductive black layer 330 corresponds to the non-pixel area of the display substrate 110, and faces the pixel definition layer 190 of the display substrate 110, and when the encapsulation substrate 310 is attached to the display substrate 110, it is contacted with the second electrode 730. Therefore, the conductive black layer 330 may be contacted with the second electrode 730 and act as the auxiliary electrode, thereby lowering the resistance thereof. In addition, since the anti-reflective light transmission layer 320 suppresses the reflection of external light and the conductive black layer 330 absorbs external light, the reflection of external light may be more lowered.

Hereinafter, referring to FIG. 5, the fourth exemplary embodiment will be described.

Figure 5:
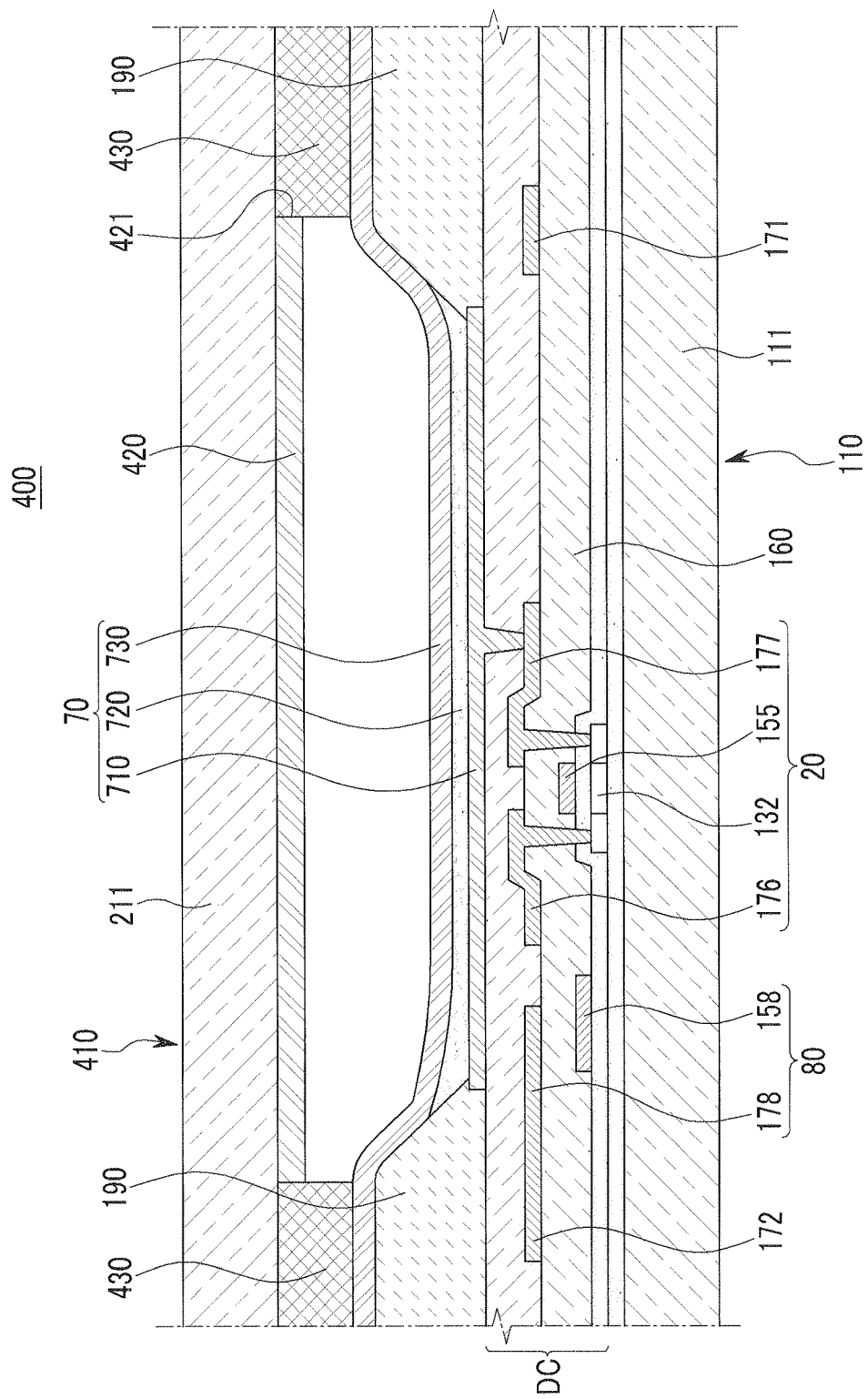
FIG. 5 is a cross-sectional view of an organic light emitting diode (OLED) display according to the fourth exemplary embodiment.

As shown in FIG. 5, the organic light emitting diode (OLED) display 400 according to the fourth exemplary embodiment includes a display substrate 110 that includes the organic light emitting diode 70, and an encapsulation substrate 410 attached and sealed to the display substrate 110.

A anti-reflective light transmission layer 420 and a conductive black layer 430 are formed on the second substrate main body 211 of the encapsulation substrate 410. The anti-reflective light transmission layer 420 is disposed at a portion facing the pixel area of the display substrate 110, and the conductive black layer 430 is disposed at a portion facing the non-pixel area of the display substrate 110. In the anti-reflective light transmission layer 420, a hole 421 is formed at the portion facing the non-pixel area of the display substrate 110, and the conductive black layer 430 is inserted into the hole 421.

Since the conductive black layer 430 is contacted with the second electrode 730 of the display substrate 110, the conductive black layer 430 acts as the auxiliary electrode, thereby lowering power consumption according to resistance. The conductive black layer 430 suppresses the reflection of external light by absorbing external light in the non-pixel area.

Meanwhile, the anti-reflective light transmission layer 420 improves the light extraction efficiency by suppressing the reflection of external light and allowing light that is generated in the organic light emitting diode 70 to not be reflected but emitted to the outside.

In the exemplary embodiment, in the pixel area, the anti-reflective light transmission layer 420 suppresses the reflection of external light, and in the non-pixel area, since the conductive black layer 430 suppresses the reflection of external light, it is possible to improve the light extraction efficiency and largely lower the reflection of external light of the entire organic light emitting diode (OLED) display 400.

Hereinafter, referring to FIG. 6, the fifth exemplary embodiment will be described.

Figure 6:
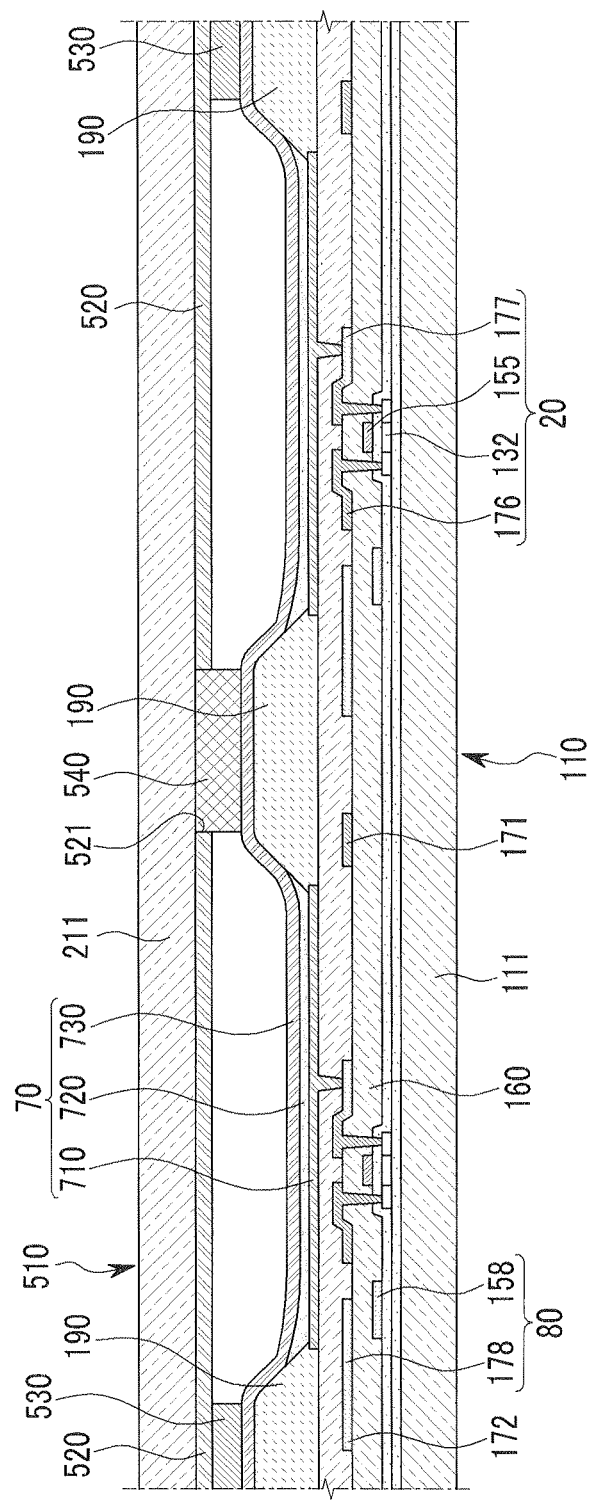
FIG. 6 is a cross-sectional view of an organic light emitting diode (OLED) display according to the fifth exemplary embodiment.

As shown in FIG. 6, the organic light emitting diode (OLED) display 500 according to the fifth exemplary embodiment includes a display substrate 110 that includes the organic light emitting diode 70, and an encapsulation substrate 510 attached and sealed to the display substrate 110. An anti-reflective light transmission layer 520, a conductive non-black layer 530 and a conductive black layer 540 are formed on the second substrate main body 211 of the encapsulation substrate 510. The conductive non-black layer 530 is made of electrical conductive material having no black, and the conductive black layer 540 is made of electrical conductive material having black. That is, in the fifth exemplary embodiment, the non-black layer and the black layer configure the conducting material layer.

The anti-reflective light transmission layer 520 is disposed at a portion facing the pixel area of the display substrate 110, and the conductive non-black layer 530 and the conductive black layer 540 are disposed at a portion facing the non-pixel area of the display substrate 110. Herein, the non-black layer 530 means a conductive layer that does not include the black material included in the black layer 540.

The conductive non-black layer 530 and the conductive black layer 540 are alternately disposed while the organic light emitting diode 70 is disposed therebetween. That is, the conductive black layer 540 is formed in the other non-pixel area that is adjacent to the non-pixel area in which the conductive non-black layer 530 is formed. Moreover, the conductive non-black layer 530 is formed on the anti-reflective light transmission layer 520 and the conductive black layer 540 is formed between the anti-reflective light transmission layers 520. That is, a hole 521 is formed in the anti-reflective light transmission layer 520, and the conductive black layer 540 is inserted into the hole 521. Herein, the thickness of the conductive black layer 540 is larger than the thickness of the conductive non-black layer 530, and the conductive non-black layer 530 and the conductive black layer 540 are electrically connected to the second electrode 730 and act as the auxiliary electrode.

The conductive black layer 540 is made of the black material, or the material that is colored with black, such that the resistance of the conductive black layer 540 becomes larger than the resistance of the conductive non-black layer 530. The thickness of the conductive black layer 540 is larger than the thickness of the non-black layer 530, such that the conductive black layer 540 may lower sufficient resistance. In addition, the conductive black layer 540 absorbs external light, the portion in which the conductive black layer 540 may sufficiently prevent the reflection of external light without the anti-reflective light transmission layer 520.

As described above, according to the exemplary embodiment, the anti-reflective light transmission layer 520 suppresses the reflection of external light and improves the light extraction efficiency and the conductive black layer 540 absorbs external light, thereby more suppressing the reflection of external light. In addition, since the conductive non-black layer 530 and conductive black layer 540 are electrically connected to the second electrode 730, power consumption can be lowered.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
    a display substrate including a plurality of organic emission layers and an electrode formed on the plurality of the organic emission layers; and
    an encapsulation substrate facing the display substrate, the encapsulation substrate comprising:
        a substrate main body;
        an anti-reflective light transmission layer formed on a surface of the substrate main body, a groove being formed on the anti-reflective light transmission layer; and
        a conducting material layer formed on the surface of the substrate main body, the conducting material layer directly contacting a surface of the anti-reflective light transmission layer, the conducting material layer being electrically connected to the electrode of the display substrate, each of the organic emission layers being disposed in a place of the display substrate that does not overlap with the conducting material layer, the conducting material layer being inserted into the groove.

2. The organic light emitting diode (OLED) display of claim 1, wherein the display substrate includes a substrate main body that has a plurality of pixel areas separated from each other and a non-pixel area positioned between two of the pixel areas, each of the organic emission layers being disposed in one of the pixel areas.

3. The organic light emitting diode (OLED) display of claim 2, wherein the conducting material layer corresponds to the non-pixel area.

4. The organic light emitting diode (OLED) display of claim 3, wherein the conducting material layer includes one material selected from the group consisting of silver (Ag), chromium (Cr), conductive carbon, and combinations thereof.

5. The organic light emitting diode (OLED) display of claim 1, wherein the conducting material layer is formed of a conductive black layer having black.

6. The organic light emitting diode (OLED) display of claim 5, wherein the conductive black layer includes metal colored with black or carbon black having electrical conductivity.

7. The organic light emitting diode (OLED) display of claim 1, wherein the display substrate includes a substrate main body that has a plurality of pixel areas separated from each other and a non-pixel area positioned between two of the pixel areas, the conducting material layer including a black layer having black and a non-black layer having no black.

8. The organic light emitting diode (OLED) display of claim 7, wherein the black layer and the non-black layer correspond to the non-pixel area and the black layer and the non-black layer are alternately disposed.

9. The organic light emitting diode (OLED) display of claim 7, wherein the non-black layer is formed on a surface of the anti-reflective light transmission layer, and the black layer is inserted into a hole formed in the anti-reflective light transmission layer.

10. The organic light emitting diode (OLED) display of claim 1, wherein the surface of the substrate main body of the encapsulation substrate, on which the anti-reflective light transmission layer is formed, faces the display substrate.

11. The organic light emitting diode (OLED) display of claim 1, wherein the anti-reflective light transmission layer includes any one material that is selected from the group consisting of polyethyleneterephthalate (PET), triacetylcellulose (TAC), and polyvinyl alcohol (PVA).

* * * * *